(12) United States Patent
Beausoleil et al.

(10) Patent No.: US 7,492,803 B2
(45) Date of Patent: Feb. 17, 2009

(54) FIBER-COUPLED SINGLE PHOTON SOURCE

(75) Inventors: Raymond G. Beausoleil, Redmond, WA (US); Sean Spillane, Mountain View, CA (US); Philip J. Kuekes, Menlo Park, CA (US); Duncan Stewart, Menlo Park, CA (US); M. Salful Islam, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 299 days.

(21) Appl. No.: 11/149,511

(22) Filed: Jun. 10, 2005

(65) Prior Publication Data
US 2006/0280414 A1    Dec. 14, 2006

(51) Int. Cl.
*H01S 5/00* (2006.01)
(52) U.S. Cl. ............... 372/50.124; 372/50.11; 977/951
(58) Field of Classification Search ............ 372/50.124, 372/50.11; 977/762, 932, 951
See application file for complete search history.

(56) References Cited

U.S. PATENT DOCUMENTS

| | | | |
|---|---|---|---|
| 5,796,714 A * | 8/1998 | Chino et al. ............ 372/50.124 |
| 6,052,178 A * | 4/2000 | Hirano ................ 356/73.1 |
| 6,416,575 B2 * | 7/2002 | Yamada ................ 117/2 |
| 7,133,590 B2 * | 11/2006 | Shaw et al. ............ 385/122 |
| 2002/0172820 A1 * | 11/2002 | Majumdar et al. ........ 428/357 |
| 2002/0196827 A1 | 12/2002 | Shields et al. |
| 2003/0063748 A1 | 4/2003 | Shields |
| 2003/0063861 A1 * | 4/2003 | Fouquet et al. ........... 385/52 |
| 2003/0127608 A1 | 7/2003 | Shields et al. |
| 2004/0149982 A1 * | 8/2004 | Michler ................ 257/14 |
| 2005/0089292 A1 * | 4/2005 | Kinoshita ............... 385/129 |
| 2005/0094679 A1 * | 5/2005 | Kafka et al. ............. 372/18 |
| 2005/0181624 A1 * | 8/2005 | Kammler et al. .......... 438/766 |
| 2005/0230697 A1 * | 10/2005 | Kwon et al. ............. 257/95 |

FOREIGN PATENT DOCUMENTS

| | | |
|---|---|---|
| JP | 07-193331 | 7/1995 |
| JP | 2001-237496 | 8/2001 |
| JP | 2002-033553 | 1/2002 |

OTHER PUBLICATIONS

Yang et al, Room-Temperature Ultraviolet Nanowire Nanolasers, Science, vol. 892, pp. 1897-1899.*
K Srinivasan et al-"Optical-fiber-based measurement of an ultrasmall volume high-Q. photonic crystal microcavity"-Physical Review B vol. 70 No. 8 Aug. 15, 2004.
In-Kag Hwang et al-"Curved-microfiber photon coupling for photonic crystal light emitter"-Applied Physics Letters—vol. 87 No. 14—Sep. 23, 2005.

* cited by examiner

*Primary Examiner*—Armando Rodriguez

(57) ABSTRACT

A device comprising a single photon generator and a waveguide, wherein a single photon generated by the single photon generator is coupled to the waveguide.

20 Claims, 6 Drawing Sheets

FIBER-COUPLED SINGLE PHOTON SOURCE

FIELD

The invention relates to the field of photons nanotechnology, and more specifically, to a new and useful method for coupling a single photon to a waveguide.

BACKGROUND

Nanotechnology and quantum information technology are emerging branches of science that involve the design of extremely small electronic and optical circuits that are built at the molecular level. Traditional opto-electronic circuits are fabricated using semiconductor wafers to form chips. Circuits are etched into the semiconductor wafers or chips. The etching process removes material from certain regions or layers of the chips. In contrast, nanotechnology generally deals with devices built upward by adding material, often a single atom at a time. This technique results in a device where every particle could have a purpose. Thus, extremely small devices, much smaller than devices formed by etching, are possible. For example, a logic gate could be constructed from only a few atoms. An electrical conductor can be built from a "nanowire" that is a single atom thick. A bit of data could be represented by the presence or absence of a single proton.

Quantum information technology provides a new avenue for creating smaller and potentially more powerful computers. Scientific theories such as quantum superposition and quantum entanglement are now being used to explore the possibility of creating smaller, more powerful computing devices. The development in this field has lead to the use of light particles, or photons, to convey information. Light has the ability to be polarized into various states (e.g., horizontally polarized, vertically polarized). Exploiting this property allows a single photon to represent a single quantum bit of information.

SUMMARY

A method and apparatus for coupling a single photon to a waveguide is provided. In an illustrative implementation, a device comprising a single photon generator and waveguide is provided wherein a single photon generated by the single photon generator is coupled to the waveguide.

BRIEF DESCRIPTION OF THE DRAWINGS

For the purpose of illustrating the invention, there is shown in the drawings one exemplary implementation; however, it is understood that this invention is not limited to the precise arrangements and instrumentalities shown.

DETAILED DESCRIPTION

Overview

The use of quantum bits provides researchers with significant potential advancements in computing technology. The ability to understand and utilize the theories of photon superposition and entanglement to generate information is a new field around which there is significant interest. However, one important issue that surrounds potential use of photons as quantum bits is the need to generate a photon on demand at the location where it is desired.

Generating a usable photon is essentially a two step process. First, a system or element is needed that will emit a photon on demand. Recent advances have been made in this area by using electrically driven or optically driven quantum dots. Quantum dots are capable of generating a single photon when excited by an electrical charge or an optical laser. A quantum dot may be incorporated into a nanowire laser, which can be electrically or optically coupled to a power source. This allows the quantum dot to be excited and thus causes a photon to be generated. A technique for using a quantum dot in a nanowire laser to generate a single photon is disclosed in U.S. patent application Ser. No. 11/084,886 filed Mar. 21, 2005 entitled "A nano-VCSEL Device and Fabrication Thereof Using Nano-Colonnades," which is fully incorporated herein by reference.

Figure 1:
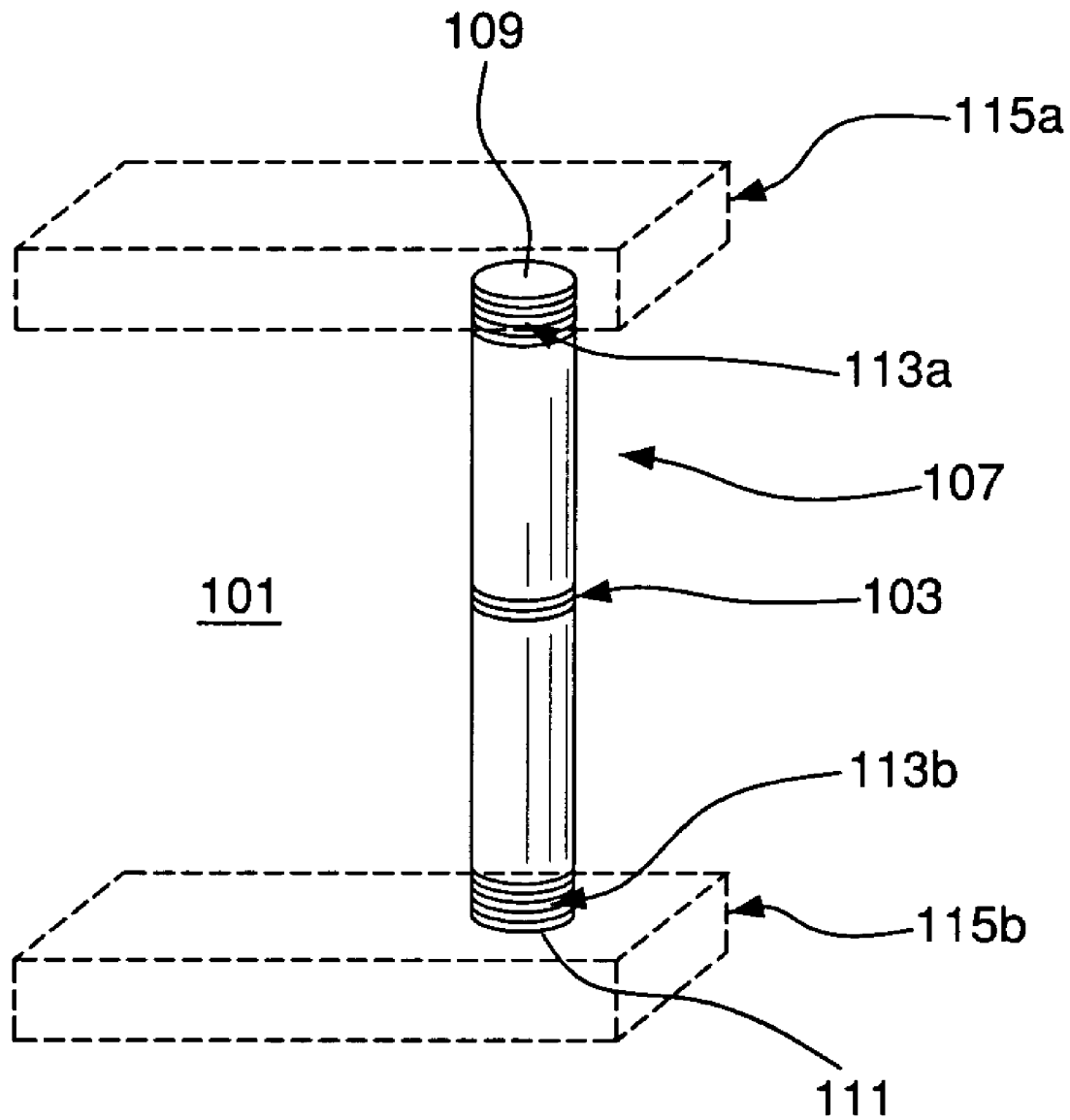
FIG. 1 illustrates a nanowire laser in accordance with an exemplary embodiment of the invention.

FIG. 1 illustrates an exemplary nanowire laser 101 that may be used for generating a photon. The nanowire laser 101 typically comprises a nanowire 107 and an active region 103. The nanowire 107 is typically grown in a semiconductor substrate. Group IV, Group III-V, or Group II-VI semiconductor materials may be used. A typical material may comprise Si or GaAs. A nanowire 107 is grown on either side of an active region 103. The nanowire 107 is very small in diameter relative to a wavelength of light produced by the active region. Typically, the nanowire portion 107 of the nanowire laser 101 is approximate 10-100 nm in diameter.

An active region 103 resides within the nanowire 107. The active region 103 comprises a quantum dot. A quantum dot is typically formed from a material that has a bandgap that is different from the bandgap of the material that comprises the nanowire. This allows the quantum dot to be excited, either electrically excited by supplying a charge via current supply leads 115a, 115b, or optically excited via a laser (not shown), in order to emit a photon. For example, a semiconductor material such as InGaAs may be used to form a quantum dot within a nanowire that comprises InP. InGaAs has a low bandgap relative to InP.

The structure of the nanowire laser 101 typically results in a generated photon typically traveling within the laser in a lengthwise direction, towards a first end 109 or a second end 111. At each end of the laser 101, a Bragg mirror 113a, 113b is grown in the crystal material. Bragg mirrors are known within the art and are used in applications that require high reflectivity. The Bragg mirror 113b at one end of the laser (shown as the second end 111 in FIG. 1) is constructed to be of a higher reflectivity than the Bragg mirror 113a at the opposite end of the laser (shown as first end 109 in FIG. 1). As a result, the probability that a generated photon will exit the laser from the first end 109 is increased.

Once a photon is generated, it must still be captured and carried to a location where it can be used. Thus, the second step in photon use is the ability to detect and capture the photon. Detecting and capturing a single photon can be a difficult task in light of the small size of a nanowire laser in comparison to traditional optical lasers. Traditionally, generated photons have been detected by directing the photons onto a photo-detector capable of detecting the presence of photons. In order to allow the photo-detector to determine the presence of photons, the photons may be focused on the photo-detector by placing a large lens in close proximity to the photon source. The lens functions to re-direct the path of any photons striking it onto the photo-detector. However, even with an increased probability that the photon will exit a particular end of the nanowire laser (e.g., first end 109), the direction of a photon generated from a nanowire is often unpredictable. The use of the lens allows an increase in the probability that generated photons will be detected by the photo-detector, but many photons may still simply be lost because the lens fails to either capture the photons or focus the photons onto the center of the detector's image plane. Additionally, this technique is somewhat limited because the generated photons are not able to be easily transported (e.g., via a waveguide) where it can be more efficiently used for quantum computation.

Photon Coupling Technique

Figure 2:
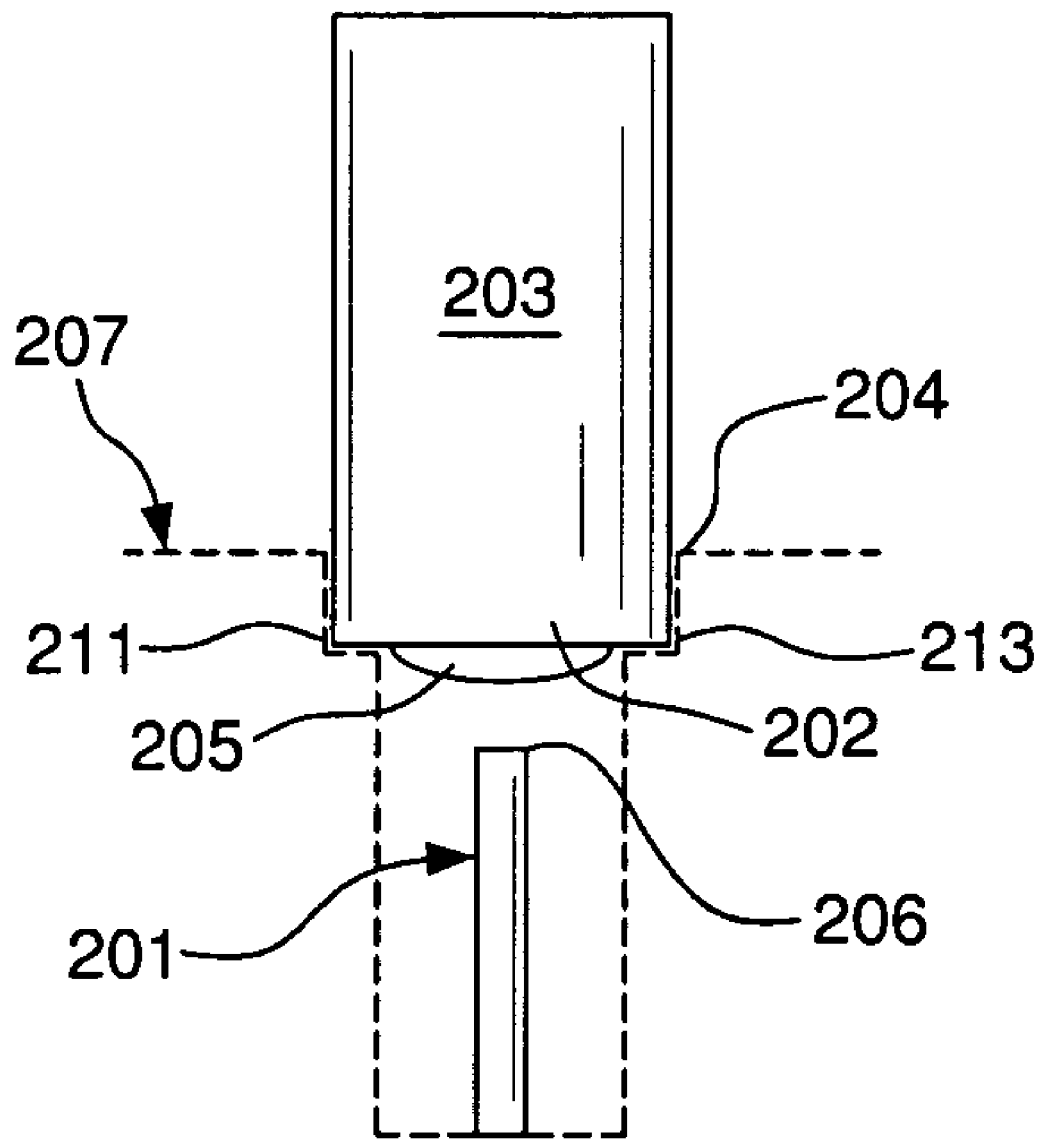
FIG. 2 illustrates a nanowire laser coupled to a waveguide in accordance with an exemplary embodiment of the invention.

Referring to FIG. 2, an exemplary embodiment of a device for coupling a single photon to an optical fiber in accordance with the present invention is shown. The exemplary embodiment shown in FIG. 2 can couple a single photon between a nanowire laser 201 and a waveguide 203 without incorporating an independent lens or photodetector. The coupling technique used comprises capturing a photon that is generated by a nanowire laser 201 and emitted from one end 206 of the nanowire laser 201 in an optical fiber waveguide 203. In one exemplary embodiment, the optical fiber waveguide 203 has a lens 205 polished on the end 202 facing the laser 201. The lens 205 facilitates entry of the photon into the fiber by increasing the angular acceptance of the fiber end 202. An anti-reflection coating may be applied to the fiber end to reduce its reflectivity. One of several known techniques may be used to form the lens 205, for example, by using a $CO_2$ laser to melt and reshape the fiber tip.

While this technique improves the likelihood of capturing a photon generated by the laser 201, maintaining the desired mechanical positioning relationship between the laser 201 and the fiber 203 is difficult. To overcome this difficulty, the fiber 203 can be precisely positioned on the surface of a substrate 207. Typically, the nanowire 201 laser is grown within a substrate 207 such as silicon. Alignment fiducials 211, 213 may be etched into the surface of the substrate 207. This creates an indexing recess 204 into which the fiber 203 can be positioned. By accurately indexing the fiber 203 to the location of the laser 201, the mechanical positioning between the laser 201 and the fiber 203 can be better maintained and, as a result, the probability of capturing a generated photon is increased. To maintain the alignment, the fiber 203 may be secured in place using known techniques, such as using an adhesive.

Figure 3:
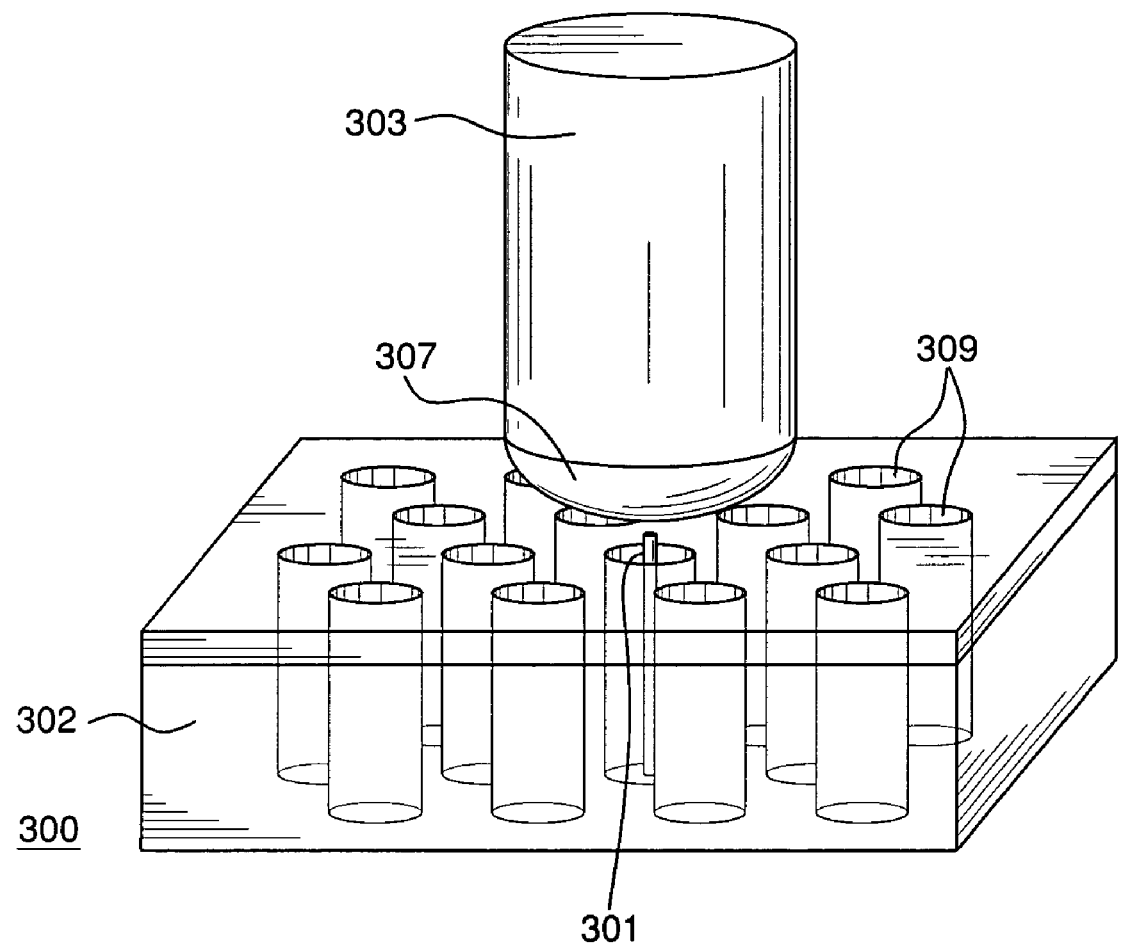
FIG. 3 illustrates a nanowire laser coupled to a waveguide in accordance with an exemplary embodiment of the invention.

In some instances, fabricating a structure to perform the coupling as described above and shown in FIG. 2 can be difficult. The direct coupling process may be improved by using a configuration as shown in FIG. 3. A nanowire laser 301 may be embedded into a substrate 300 that comprises a two dimensional photonic crystal 302. Two dimensional photonic crystals can provide Bragg reflections and large index dispersion in a two dimensional plane. At each interface within the crystal, light is partly reflected and partly transmitted. By using this property of photonic crystals, the photon emitted by the laser can be better mode matched to the fundamental mode of a fiber 303.

Additionally, by embedding the nanowire laser 301 in the two dimensional photonic crystal 302, the evanescent fields emitted by the laser are controlled. Evanescent fields are energy fields that escape from the laser through the laser sides. For example, light will propagate a short distance beyond the plane of total internal reflection, which in this case is the edges of the nanowire laser 301. By embedding the nanowire laser 301 into the a two dimensional photonic crystal substrate 302, such as glass coated with a InGaAs or $Si/SiO_2$ coating, evanescent fields are prevented from emanating from the laser 301. A fiber 303 having a lens 307 formed on the fiber end is positioned in close proximity (e.g., less than one micron) to the laser 301 to capture a generated photon. A pattern of holes 309 may be etched into the two dimensional photonic crystal, which may be used for aligning the fiber in a precise mechanical position relative to the laser 301.

Figure 4:
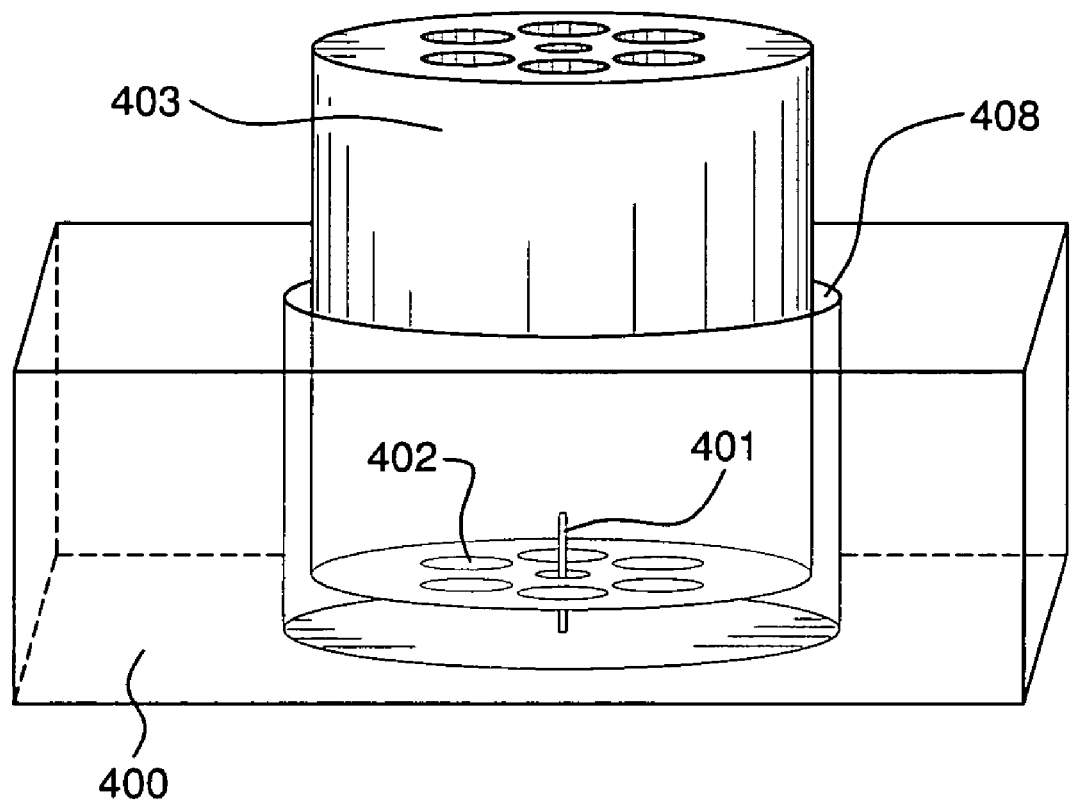
FIG. 4 illustrates a nanowire laser coupled to a waveguide in accordance with an exemplary embodiment of the invention.

An alternative embodiment for enabling direct coupling of a nanowire laser to a waveguide is shown in FIG. 4. In the embodiment shown in FIG. 4, a photonic crystal fiber 403 is used instead of a tapered fiber. Photonic crystal fiber, referred to as "holey" fiber, comprises a plurality of airhole passages 402 residing within the fiber 403. A nanowire laser 401 is positioned such that it extends into an airhole passage 402 of the fiber 403. The nanowire laser 401 is grown in a substrate 400. An indexing hole 408 is etched in the substrate 400 surrounding the laser 401. The photonic crystal fiber 403 is positioned within the indexing hole 408 such that the laser 401 extends into a selected air hole passage 402 contained within the fiber 403. Using this configuration provides for several advantages. The nanowire laser 401 can be precisely positioned relative to the fiber 403. Additionally, the coupling efficiency can be improved by means of mode-matching between the evanescent mode of the nanowire laser 401 and the evanescent mode of the fiber 403, coupled with the fact that photonic crystal fiber typically has a larger numerical aperture than conventional single mode fiber, such as is commonly used in the telecommunications industry (e.g., single mode fiber typically has a numerical aperture ranging from approximately 0.2-0.5 while photonic crystal fiber typically has a numerical aperture ranging from approximately 0.7-0.9).

Coupling between a nanowire laser and a fiber may also be achieved using evanescent mode coupling. The evanescent coupling between two adjacent waveguides is determined by the rate at which energy is transferred from one waveguide into the other, which in turn is proportional to the overlap of the electric fields of the two waveguides:

$$c(z) \propto \int d^2r \, E_1^*(r) \cdot E_2(r) \qquad \text{Equation (1)}$$

where $c(z)$ is the mode overlap between two waveguides; z is the coordinate axis parallel to the axes of the waveguides; $E_1(r)$ is the electric field profile of the eigenmode in waveguide 1 at a point $r=\{x, y, z\}$; $E_2(r)$ is the electric field profile of the eigenmode in waveguide 2 at the same point. The primary propagation axes of the waveguides are oriented in the z direction, and the two dimensional integral is performed over the transverse coordinates $\{x, y\}$, assuming a weak-coupling limit where the presence of one waveguide does not affect the modes of the other. The coupled wave equations are generally integrated over a distance z that is long compared to the wavelength, giving a substantial integrated mode overlap. In principle, the nanowire laser will be so short that the integrated mode overlap of the evanescent fields will be small, but in practice multiple passes of the electromagnetic field between the Bragg mirrors of a high-Q resonator will allow a substantial optical path length to be accumulated.

Figure 5:
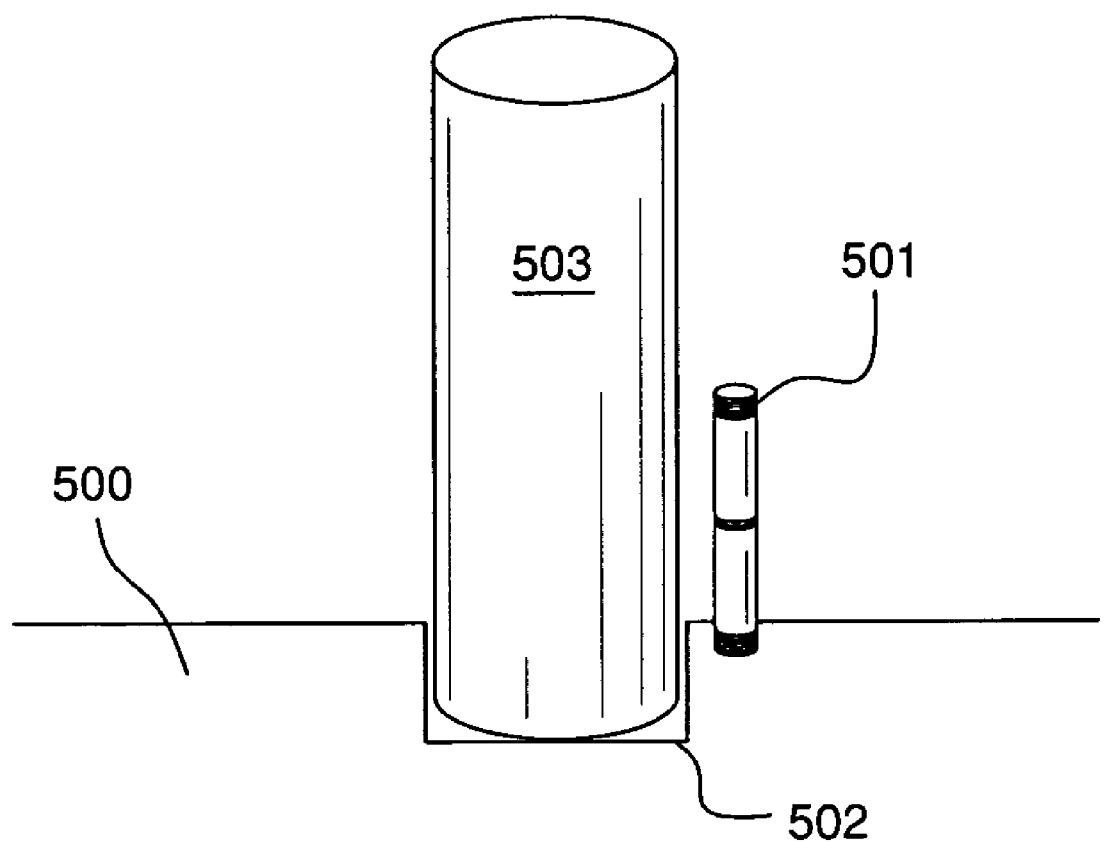
FIG. 5 illustrates a nanowire laser coupled to a waveguide in accordance with an exemplary embodiment of the invention.

An exemplary embodiment illustrating the evanescent coupling of a nanowire laser and a fiber is shown in FIG. 5. A tapered fiber 503 is positioned in a substrate 500 using an etched alignment fiducial 502. The fiber 503 is positioned proximate to a nanowire laser 501. The evanescent fields produced by the laser 501 are coupled to the fiber 503 in accordance with equation 1 set forth above.

Figure 6:
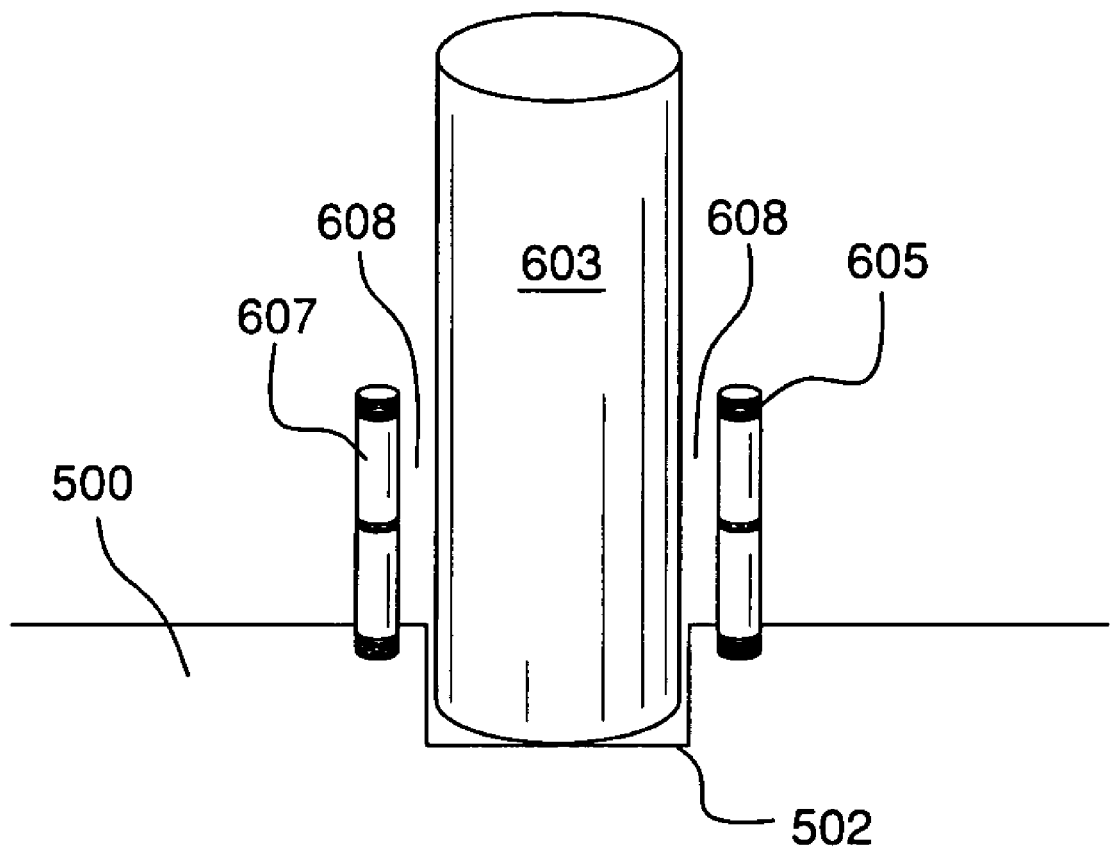
FIG. 6 illustrates a nanowire laser coupled to a waveguide in accordance with an exemplary embodiment of the invention.

Other evanescent configurations may be constructed based on the configuration described above. For example, a collection of nanowire lasers can be arranged circumferentially around a tapered fiber. FIG. 6 shows a fiber 603 positioned in a substrate 500 with two nanowire lasers 605, 607 positioned adjacent to the fiber 603. While two nanowire lasers 605, 607 are shown for simplicity, any number of nanowire lasers could be used. If the nanowire lasers 605, 607 are identical and operated in tandem, the rate at which single photons of the same wavelength are generated can be increased. Alternatively, using nanowire lasers that differ in active material and/or structure allows for single photons of distinct wavelengths to be coupled into a single fiber, provided that the propagating modes at each distinct wavelength are supported by the fiber. Additionally, a region 608 that exists between the fiber and the waveguide could be filled with an index-matching material to enhance the coupling between the nanowire lasers and the fiber.

A variety of modifications to the embodiments described will be apparent to those skilled in the art from the disclosure provided herein. Thus, the present invention may be embodied in other specific forms without departing from the spirit or essential attributes thereof and, accordingly, reference should be made to the appended claims, rather than to the foregoing specification, as indicating the scope of the invention.

What is claimed is:

1. A device comprising:
   a substrate having at least one hole;
   a nanowire laser positioned within the at least one hole; and
   a waveguide positioned proximal to said at least one hole so that a single photon generated by said nanowire laser is coupled into said waveguide.

2. The device as set forth in claim 1, wherein said nanowire laser further comprises:
   a quantum dot residing within a nanowire;
   a first Bragg reflector located at a first end of said nanowire; and
   a second Bragg reflector located at a second end of said nanowire, wherein said first Bragg reflector has a lower reflectivity than said second Bragg reflector.

3. The device as set forth in claim 1, wherein said waveguide is aligned with said nanowire laser via an alignment recess etched in said substrate.

4. The device as set forth in claim 1, wherein said substrate is a photonic crystal.

5. The device as set forth in claim 1, wherein said coupling is evanescent mode coupling.

6. The device as set forth in claim 1, wherein said waveguide is an optical fiber.

7. The device as set forth in claim 6, wherein said fiber is a photonic crystal fiber.

8. A device comprising:
   a substrate having an alignment fiducial;
   at least one nanowire laser positioned on said substrate proximal to said alignment fiducial; and
   a waveguide, wherein at least a portion of said waveguide is positioned within said alignment fiducial so that a photon generated by said at least one nanowire laser is coupled into said waveguide.

9. The device as set forth in claim 8, wherein said coupling is evanescent mode coupling.

10. The device as set forth in claim 8 wherein said waveguide is an optical fiber.

11. The device as set forth in claim 10, wherein said fiber is a photonic crystal fiber.

12. A method for coupling a single photon into a waveguide comprising:
    positioning a nanowire laser proximal to said waveguide;
    generating a single photon within said nanowire laser;
    emitting said single photon from a first end of said nanowire laser; and
    coupling said single photon emitted from said nanowire laser into said waveguide.

13. The device as set forth in claim 12, wherein said nanowire laser further comprises:
    a quantum dot residing within a nanowire;
    a first Bragg reflector located at a first end of said nanowire; and
    a second Bragg reflector located at a second end of said nanowire, wherein said first Bragg reflector has a lower reflectivity than said second Bragg reflector.

14. The method as set forth in claim 13 wherein said nanowire laser is encapsulated within a substrate.

15. The method as set forth in claim 14, wherein said substrate is a photonic crystal.

16. The method as set forth in claim 12, wherein said coupling is evanescent mode coupling.

17. The method as set forth in claim 12, wherein said waveguide is an optical fiber.

18. The method as set forth in claim 17, wherein said fiber is a photonic crystal.

19. The device as set forth in claim 8, wherein said nanowire laser further comprises:
    a quantum dot residing within a nanowire;
    a first Bragg reflector located at a first end of said nanowire; and
    a second Bragg reflector located at a second end of said nanowire, wherein said first Bragg reflector has a lower reflectivity than said second Bragg reflector.

20. The device as set forth in claim 8, wherein said nanowire laser has a diameter measuring less than approximately 100 nm.

* * * * *

UNITED STATES PATENT AND TRADEMARK OFFICE
CERTIFICATE OF CORRECTION

PATENT NO. : 7,492,803 B2 Page 1 of 1
APPLICATION NO. : 11/149511
DATED : February 17, 2009
INVENTOR(S) : Raymond G. Beausoleil et al.

It is certified that error appears in the above-identified patent and that said Letters Patent is hereby corrected as shown below:

On the face page, in field (75), in "Inventors", in column 1, line 5, delete "Salful" and insert -- Saiful --, therefor.

Signed and Sealed this

Fourteenth Day of July, 2009

JOHN DOLL
*Acting Director of the United States Patent and Trademark Office*